(12) United States Patent
Laughlin et al.

(10) Patent No.: US 8,969,709 B2
(45) Date of Patent: *Mar. 3, 2015

(54) USE OF A CONDUCTIVE COMPOSITION CONTAINING LEAD—TELLURIUM-BASED OXIDE IN THE MANUFACTURE OF SEMICONDUCTOR DEVICES WITH LIGHTLY DOPED EMITTERS

(75) Inventors: Brian J. Laughlin, Apex, NC (US); Kurt Richard Mikeska, Hockessin, DE (US); Carmine Torardi, Wilmington, DE (US); Paul Douglas Vernooy, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 274 days.

This patent is subject to a terminal disclaimer.

(21) Appl. No.: 13/598,861

(22) Filed: Aug. 30, 2012

(65) Prior Publication Data

US 2014/0060632 A1 Mar. 6, 2014

(51) Int. Cl.
*H01L 31/0224* (2006.01)
*C03C 8/10* (2006.01)
*C03C 8/16* (2006.01)
*C03C 8/18* (2006.01)
*H01B 1/22* (2006.01)
*H01L 31/18* (2006.01)

(52) U.S. Cl.
CPC .......... *H01L 31/022425* (2013.01); *C03C 8/10* (2013.01); *C03C 8/16* (2013.01); *C03C 8/18* (2013.01); *H01B 1/22* (2013.01); *H01L 31/18* (2013.01)
USPC ........................................ 136/250

(58) Field of Classification Search
CPC ................... H01L 31/022425; H01L 31/0264; B22F 1/0059; B22F 7/04; B22F 2007/047; C03C 8/10
USPC ............. 136/256; 252/513; 257/741, E23.01, 257/E21.159; 438/660
See application file for complete search history.

(56) References Cited

U.S. PATENT DOCUMENTS

| 5,240,884 A | 8/1993 | Herrington et al. |
| 7,608,206 B1 | 10/2009 | Vernooy et al. |
| 7,951,311 B2 | 5/2011 | Vernooy et al. |
| 2011/0094578 A1* | 4/2011 | Akimoto et al. ............... 136/256 |
| 2011/0192456 A1 | 8/2011 | Hang et al. |
| 2011/0232746 A1 | 9/2011 | Carroll et al. |
| 2012/0067415 A1* | 3/2012 | Tachizono et al. ............ 136/256 |

FOREIGN PATENT DOCUMENTS

| JP | 2014-93312 | * 5/2014 |
| WO | 2012/129554 A2 | 9/2012 |

OTHER PUBLICATIONS

EL1121 EP Search Report.

(Continued)

*Primary Examiner* — Jayne Mershon (57) ABSTRACT

The present invention provides a process for using a thick-film conductive paste composition to form an electrode on a silicon semiconductor device, e.g, a photovoltaic cell, containing a lightly doped emitter. The thick-film paste comprises a source of an electrically conductive metal and a Pb—Te-based oxide dispersed in an organic medium. Also provided are devices made by the process and a photovoltaic cell comprising a lightly doped emitter and an electrode formed from the thick-film conductive paste composition.

12 Claims, 1 Drawing Sheet

(56) References Cited

OTHER PUBLICATIONS

Scotten W. Jones, "Diffusion in Silicon", IC Knowledge LLC, Apr. 25, 2008.
U.S. Appl. No. 13/100,540, filed May 4, 2011, Carroll et al.
U.S. Appl. No. 13/100,550, filed May 4, 2011, Carroll et al.
U.S. Appl. No. 13/100,563, filed May 4, 2011, Carroll et al.
U.S. Appl. No. 13/100,533, filed May 4, 2011, Carroll et al.
U.S. Appl. No. 13/100,619, filed May 4, 2011, Mikeska et al.
U.S. Appl. No. 13/438,093, filed Apr. 3, 2012, Hang et al.

* cited by examiner

USE OF A CONDUCTIVE COMPOSITION CONTAINING LEAD—TELLURIUM-BASED OXIDE IN THE MANUFACTURE OF SEMICONDUCTOR DEVICES WITH LIGHTLY DOPED EMITTERS

FIELD OF THE INVENTION

The present invention is directed to a process for using a thick-film conductive composition to form an electrode on a silicon semiconductor device. In particular, it is directed to forming an electrode on a silicon semiconductor containing a lightly doped emitter. It is further directed to a silicon semiconductor device containing such an electrode.

TECHNICAL BACKGROUND

A conventional photovoltaic cell incorporates a semiconductor structure with a junction, such as a p-n junction formed with an n-type semiconductor and a p-type semiconductor. For the typical p-base configuration, a negative electrode is located on the side of the cell that is to be exposed to a light source (the "front" side, which in the case of a solar cell is the side exposed to sunlight), and a positive electrode is located on the other side of the cell (the "back" side). This cell has a front n-type emitter silicon surface. Radiation of an appropriate wavelength, such as sunlight, falling on the p-n junction serves as a source of external energy that generates electron-hole pair charge carriers. These electron-hole pair charge carriers migrate in the electric field generated by the p-n junction and are collected by electrodes on respective surfaces of the semiconductor. The cell is thus adapted to supply electric current to an electrical load connected to the electrodes, thereby providing electrical energy converted from the incoming solar energy that can do useful work. Solar-powered photovoltaic systems are considered to be environmentally beneficial in that they reduce the need for fossil fuels used in conventional electric power plants.

Industrial photovoltaic cells are commonly provided in the form of a structure, such as one based on a doped crystalline silicon wafer, that has been metalized, i.e., provided with electrodes in the form of electrically conductive metal contacts through which the generated current can flow to an external electrical circuit load. Most commonly, these electrodes are provided on opposite sides of a generally planar cell structure. Conventionally, they are produced by applying suitable conductive metal pastes or inks to the respective surfaces of the semiconductor body and thereafter firing the pastes.

Conductive pastes are typically used to form the conductive grids or metal contacts. Conductive pastes typically comprise a conductive species (e.g., silver particles), a glass frit, and an organic medium. To form the metal contacts, conductive pastes are printed onto a substrate as grid lines or other patterns and then fired, during which electrical contact is made between the grid lines and the semiconductor substrate.

However, crystalline silicon solar cells are typically coated with an anti-reflective coating (ARC) such as one or more of silicon nitride, titanium oxide, or silicon oxide to promote light adsorption, which increases the cells' efficiency. Such anti-reflective coatings also act as an insulator which impairs the flow of electrons from the substrate to the metal contacts. To overcome this problem, the conductive ink should penetrate the anti-reflective coating during firing to form metal contacts having electrical contact with the semiconductor substrate. This type of process is generally called "fire through" or "etching" of the insulating ARC. Formation of a strong bond between the metal contact and the substrate and solderability is also desirable.

The ability to penetrate the anti-reflective coating and form a strong bond with the substrate upon firing is highly dependent on the composition of the conductive ink and firing conditions. Efficiency, a key measure of solar cell performance, is also influenced by the quality of the electrical contact made between the fired conductive ink and the substrate.

Alternatively, a reverse solar cell structure with an n-type silicon base is also known. This cell has a front p-type silicon surface (front p-type emitter) with a positive electrode on the front-side and a negative electrode to contact the back-side of the cell. Solar cells with n-type silicon bases (n-type silicon solar cells) can in theory produce higher efficiency gains compared to solar cells with p-type silicon bases owing to the reduced recombination velocity of electrons in the n-doped silicon.

To provide an economical process for manufacturing solar cells with good efficiency, there is a need for thick-film paste compositions that can be fired at low temperatures to penetrate an anti-reflective coating and provide good electrical contact with the semiconductor substrate.

SUMMARY OF THE INVENTION

The present invention provides a process for forming an electrode on a silicon semiconductor substrate containing a lightly doped emitter, the process comprising:

(a) providing a junction-bearing silicon semiconductor substrate having a front-side surface and a back-side surface and comprising one or more insulating films disposed onto at least the front-side surface of the silicon semiconductor substrate and a lightly doped emitter at the front-side surface of the silicon semiconductor substrate;

(b) applying a thick-film conductive paste composition onto at least a portion of the one or more insulating films to form a layered structure, the thick-film paste composition comprising:
  i) 80-99.5 wt % of an electrically conductive metal;
  ii) 0.5 to 20 wt % of a Pb—Te-based oxide and
  iii) an organic medium, (c) wherein the electrically conductive metal and the Pb—Te-based oxide are dispersed in the organic medium and wherein the above wt % are based on the total weight of the electrically conductive metal and the Pb—Te-based oxide, the Pb—Te-based oxide comprising 30-75 wt % PbO and 25-70 wt % $TeO_2$, wherein the oxide wt % are based on the total weight of the Pb—Te-based oxide; and (d) firing the silicon semiconductor substrate, the one or more insulating films, and the thick-film paste, wherein the organic medium of the thick film paste is volatilized, thereby forming an electrode in contact with the one or more insulating layers and in electrical contact with the silicon semiconductor substrate.

In an embodiment, the Pb—Te-based oxide comprises 36-52 wt % PbO and 35-55 wt % $TeO_2$, wherein the oxide wt % are based on the total weight of the Pb—Te-based oxide.

In an embodiment, the Pb—Te-based oxide further comprises 0-2 wt % $Li_2O$, 0-4 wt % $Na_2O$ and 0-4 wt % $Cr_2O_3$, with the proviso that the total of the wt % of the $Li_2O$, the $Na_2O$ and the $Cr_2O_3$ is in the range of 0.5-8 wt %, wherein the oxide wt % are based on the total weight of the Pb—Te-based oxide.

The invention also provides a semiconductor device with a lightly doped emitter, and in particular a solar cell, comprising an electrode formed by the instant process, wherein the composition has been fired to remove the organic medium and form the electrode.

BRIEF DESCRIPTION OF THE DRAWINGS

FIGS. 1A-1F are a process flow diagram illustrating the fabrication of a semiconductor device. Reference numerals shown in FIGS. 1A-1F are explained below.
10: p-type silicon substrate
20: n-type diffusion layer
30: insulating film
40: p+ layer (back surface field, BSF)
60: aluminum paste disposed on back side
61: aluminum back electrode (obtained by firing back-side aluminum paste)
70: silver or silver/aluminum paste disposed on back side
71: silver or silver/aluminum back electrode (obtained by firing back-side silver paste)
500: thick-film paste disposed on front side
501: front electrode (formed by firing the thick-film paste)

DETAILED DESCRIPTION OF THE INVENTION

The present invention addresses the need for a process to manufacture high performance semiconductor devices having mechanically robust, high conductivity electrodes. The conductive paste composition provided herein is beneficially employed in the fabrication of front-side electrodes of photovoltaic devices. Ideally, a paste composition promotes the formation of a front-side metallization that: (a) adheres strongly to the underlying semiconductor substrate; and (b) provides a relatively low resistance contact with the substrate. Suitable paste compositions are believed to aid in etching surface insulating layers often employed in semiconductor structures such as photovoltaic cells to allow contact between the conductive electrodes and the underlying semiconductor.

As used herein, "thick-film composition" refers to a composition which, upon firing on a substrate, has a thickness of 1 to 100 microns. The thick-film compositions contain a conductive material, an oxide composition such as a glass, frit, or fusible oxide, and an organic medium. The thick-film composition may include additional components. As used herein, the additional components are termed "additives".

The composition described herein include one or more electrically functional materials and one or more glass frits dispersed in an organic medium. This composition is a thick-film paste composition. The composition may also include one or more additives. Exemplary additives include metals, metal oxides or any compounds that can generate these metal oxides during firing. Certain embodiments involve a photovoltaic cell that includes a conductive structure made with the present paste composition. Such cells may provide one or more of the following attributes: high photovoltaic conversion efficiency, high fill factor and low series resistance.

In an embodiment, the electrically functional powders may be conductive powders. In an embodiment, the composition is used in a semiconductor device. In an aspect of this embodiment, the semiconductor device may be a solar cell or a photodiode. In a further aspect of this embodiment, the semiconductor device may be one of a broad range of semiconductor devices.

Inorganic Components

An embodiment of the present invention relates to a paste composition, which may include: an inorganic solids portion comprising a functional material providing electrical conductivity, an oxide fusible material and optional additives; and an organic vehicle in which the inorganic solids are dispersed. The paste composition may further include additional components such as surfactants, thickeners, thixotropes and binders.

Electrically Conductive Metal

The thick-film composition includes a functional component that imparts appropriate electrically functional properties to the composition. The electrically functional component is an electrically conductive metal.

The source of the electrically conductive metal can be in a flake form, a spherical form, a granular form, a crystalline form, a powder or other irregular forms and mixtures thereof. The electrically conductive metal can be provided in a colloidal suspension.

The electrically conductive metal may comprise any of a variety of percentages of the composition of the paste composition. To attain high conductivity in a finished conductive structure, it is generally preferable to have the concentration of the electrically conductive metal be as high as possible while maintaining other required characteristics of the paste composition that relate to either processing or final use.

In one embodiment, the source of the electrically conductive metal is from about 80 to about 99.9 wt % of the solid components of the thick-film paste composition. Solids are defined herein as the total composition of the thick-film paste composition minus the organic medium. These weight percent (wt %) are then based on the total weight of the source of electrically conductive metal, additives, oxides, glasses, frits, and/or fusible oxides. In a further embodiment, the source of the electrically conductive metal is from about 90 to about 99.5 wt % of the solid components of the thick-film paste composition. In a still further embodiment, the source of the electrical conductive metal is from about 95 to 99 wt % of the solid components of the thick-film paste composition.

In an embodiment, the solids portion of the thick-film paste composition includes about 80 to about 90 wt % spherical electrically conductive metal particles. In one embodiment, the solids portion of the thick-film paste composition includes about 80 to about 90 wt % electrically conductive metal particles and about 1 to about 9.5 wt % electrically conductive metal flakes.

In an embodiment, the electrically conductive metal may be 60 to 95 wt % of the paste composition. In another embodiment, the electrically conductive metal may be 70 to 90 wt % of the paste composition. In a further embodiment, the electrically conductive metal may be 80 to 88 wt % of the paste composition. In a still further embodiment, the electrically conductive metal may be 85 to 87 wt % of the paste composition.

The electrically conductive metal is selected from the group consisting of Ag, Cu, Au, Pd, Pt, Sn, Al, Ni and mixtures thereof. In an embodiment, the conductive particles may include silver (Ag). In a further embodiment, the conductive particles may include silver (Ag) and aluminum (Al). In a further embodiment, the conductive particles may, for example, include one or more of the following: Cu, Au, Ag, Pd, Pt, Al, Ni, Ag—Pd and Pt—Au. In an embodiment, the conductive particles may include one or more of the following: (1) Al, Cu, Au, Ag, Pd and Pt; (2) an alloy of Al, Cu, Au, Ag, Pd and Pt; and (3) mixtures thereof.

When the metal is silver, it can be in the form of silver metal, alloys of silver or mixtures thereof. The silver can also be in the form of silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$) or mixtures thereof. Other forms of silver compatible with the other thick-film paste components can also be used.

In an embodiment, the functional phase of the composition may be coated or uncoated silver particles which are electrically conductive. In an embodiment in which the silver particles are coated, they are at least partially coated with a surfactant. In an embodiment, the surfactant may include one or more of the following non-limiting surfactants: stearic acid, palmitic acid, a salt of stearate, a salt of palmitate, lauric acid, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

In one embodiment, the silver is from about 80 to about 99.9 wt % of the solid components of the thick-film paste composition. Solids are defined herein as the total composition of the thick-film paste composition minus the organic medium. These wt % are then based on the total weight of the silver, additives, oxides and/or fusible oxides. In a further embodiment, the silver is from about 90 to about 99.5 wt % of the solid components of the thick-film paste composition. In a still further embodiment, the silver is from about 95 to 99 wt % of the solid components of the thick-film paste composition.

In an embodiment, the solids portion of the thick-film paste composition includes about 80 to about 90 wt % spherical silver particles. In one embodiment, the solids portion of the thick-film paste composition includes about 80 to about 90 wt % silver particles and about 1 to about 9.5 wt % silver flakes.

In an embodiment, the silver may be 60 to 95 wt % of the paste composition. In a further embodiment, the silver may be 70 to 90 wt % of the paste composition. In a further embodiment, the silver may be 80 to 88 wt % of the paste composition. In a further embodiment, the silver may be 85 to 87 wt % of the paste composition.

The particle size of the silver is not subject to any particular limitation. In an embodiment, the average particle size may be less than 10 microns, and, in a further embodiment, no more than 5 microns. In an aspect, the average particle size may be 0.1 to 5 microns, for example. As used herein, "particle size" is intended to mean "average particle size"; "average particle size" means the 50% volume distribution size. The 50% volume distribution size can be denoted as $D_{50}$. Volume distribution size may be determined by a number of methods understood by one of skill in the art, including but not limited to laser diffraction and dispersion method using a Microtrac particle size analyzer (Montgomeryville, Pa.). Laser light scattering, e.g., using a model LA-910 particle size analyzer available commercially from Horiba Instruments Inc. (Irvine, Calif.), may also be employed.

In one embodiment, the thick-film paste composition includes coated silver particles that are electrically conductive. Suitable coatings include phosphorous and surfactants. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts and mixtures thereof. The salt counter-ions can be ammonium, sodium, potassium and mixtures thereof.

Lead-Tellurium-Based Oxide

In an embodiment, the lead-tellurium-based oxide (Pb—Te-based oxide or Pb—Te—O) may be a glass composition. In an embodiment, the Pb—Te-based oxide can be a fusible oxide. The term "fusible," as used herein, refers to the ability of a material to become fluid upon heating, such as the heating employed in a firing operation. In some embodiments, the fusible material is composed of one or more fusible subcomponents. Glass material in the form of a fine powder, e.g. as the result of a comminution operation, is often termed "frit" and is readily incorporated in the present paste composition. In a further embodiment, these compositions may be crystalline, partially crystalline, amorphous, partially amorphous or combinations thereof. In an embodiment, the Pb—Te-based oxide composition may include more than one glass composition. In an embodiment, the Pb—Te-based oxide composition may include a glass composition and an additional composition, such as a crystalline composition. Herein, all these compositions are referred to as glasses or glass frits.

The Pb—Te-based oxide may be prepared by mixing PbO, $TeO_2$ and one or more of the additional oxides (or other materials that decompose into the desired oxides when heated) using techniques understood by one of ordinary skill in the art. Such preparation techniques may involve heating the mixture in air or an oxygen-containing atmosphere to form a melt, quenching the melt, and grinding, milling and/or screening the quenched material to provide a powder with the desired particle size. Melting the mixture of lead and tellurium oxides is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $D_{50}$ of 0.1 to 3.0 microns. One skilled in the art of producing glass frit may employ alternative synthesis techniques such as but not limited to water quenching, sol-gel, spray pyrolysis or others appropriate for making powder forms of glass.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As indicated above the Pb and Te may be supplied by various sources such as oxides, halides, carbonates, nitrates, phosphates, hydroxides, peroxides, halogen compounds and mixtures thereof. Herein, the composition of the Pb—Te-based oxide is given in terms of the equivalent oxides no matter the source of the various components. As recognized by one of ordinary skill in the art in glass chemistry, a certain portion of volatile species may be released during the process of making the glass. An example of a volatile species is oxygen.

In an embodiment, the starting mixture used to make the Pb—Te-based oxide may include (based on the weight of the total starting mixture) PbO that may be 30 to 75 wt %, 34 to 65 wt %, or 36 to 52 wt %; and $TeO_2$ that may be 25 to 70 wt %, 30 to 70 wt %, or 35 to 55 wt %.

In an embodiment the Pb—Te-based oxide further comprises 0 to 2 wt % $Li_2O$, 0 to 4 wt % $Na_2O$ and 0 to 4 wt % $Cr_2O_3$, with the proviso that the total of the wt % of said $Li_2O$, said $Na_2O$ and said $Cr_2O_3$ is in the range of 0.5 to 8 wt %, wherein the oxide wt % are based on the total weight of the Pb—Te-based oxide. In another embodiment the Pb—Te-based oxide further comprises, in addition to the one or more of $Li_2O$, $Na_2O$ and $Cr_2O_3$, 1.65 to 20 wt % $Bi_2O_3$, with the proviso that the total of the wt % of the $Li_2O$ and the $Bi_2O_3$ is in the range of 3.65 to 20 wt %, wherein the oxide wt % are based on the total weight of the Pb—Te-based oxide.

In various embodiments, based on the total starting mixture, the $Li_2O$ may be 0 to 2 wt %, 0.1 to 1.4 wt %, or 0.3 to 1 wt %; the $Na_2O$ may be 0 to 4 wt %, 0 to 1 wt %, 0.25 to 3 wt %, or 0.35 to 2.1 wt %; the $Cr_2O_3$ may be 0 to 8 wt %, 0 to 4 wt %, 0.4 to 6 wt %, or 1 to 4 wt %; and the $Bi_2O_3$ may be 0 to 30 wt %, 0 to 20 wt %, 2 to 22 wt %, or 5 to 15 wt %;

In a further embodiment, in addition to the above PbO, $TeO_2$ and the oxides mentioned above, the starting mixture used to make the Pb—Te-based oxide may include one or more of $SiO_2$, $B_2O_3$, CuO, $TiO_2$, $Ag_2O$, $Fe_2O_3$, $RuO_2$, NiO and $Al_2O_3$. In aspects of this embodiment, based on the weight of the total starting mixture:

the $SiO_2$ may be 0 to 10 wt %, 0 to 5 wt %, or 0 to 2 wt %;
the $B_2O_3$ may be 0 to 3 wt %, 0.2 to 2.2 wt %, or 0.4 to 1.2 wt %;
the CuO may be 0 to 4 wt %, 0 to 1 wt %, or 0.1 to 0.5 wt %;
the $TiO_2$ may be 0 to 4 wt %, 0 to 1 wt %, or 0.1 to 1 wt %;
the $Ag_2O$ may be 0 to 15 wt %, 0 to 10 wt %, or 5 to 10 wt %;
the $Fe_2O_3$ may be 0 to 4 wt %, 0 to 2 wt %, or 1 to 2 wt %;
the $RuO_2$ may be 0 to 4 wt %, 0 to 1 wt %, or 0.1 to 1 wt %;
the NiO may be 0 to 4 wt %, 0 to 2 wt %, or 1 to 2 wt %; and
the $Al_2O_3$ may be 0 to 5 wt %, 0 to 1 wt %, or 0.1 to 1 wt %.

In an embodiment, the Pb—Te-based oxide may be a homogenous powder. In a further embodiment, the Pb—Te-based oxide may be a combination of more than one powder, wherein each powder may separately be homogenous. The composition of the overall combination of the multiple powders is within the ranges described above. For example, the Pb—Te-based oxide may include a combination of two or more different powders; separately, these powders may have different compositions, and may or may not be within the ranges described above; however, the combination of these powders is within the ranges described above.

In a further embodiment, the Pb—Te-based oxide composition herein may include one or more of another set of components: $GeO_2$, $P_2O_5$, ZnO, $Ga_2O_3$, $In_2O_3$, CoO, $Co_2O_3$, $Co_3O_4$, CaO, $MoO_3$, $WO_3$, MgO, PdO, SrO, MnO, BaO, $SeO_2$, $Y_2O_3$, $As_2O_3$, $Nd_2O_3$, $Nb_2O_5$, $Sb_2O_5$, $Sb_2O_3$, $Ta_2O_5$, $HfO_2$, CdO, $Mn_2O_3$, $Cu_2O$, $La_2O_3$, $Pr_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, SnO, $SnO_2$, $K_2O$, $Rb_2O$, $Cs_2O$, and metal halides (e.g., NaCl, KBr, NaI and LiF).

Therefore as used herein, the Pb—Te-based oxide may also include metal oxides that contain one or more elements selected from the group consisting of: Ge, P, Zn, Ga, In, Co, Ca, Mo, W, Mg, Pd, Sr, Mn, Ba, Se, Y, As, La, Nd, Nb, Sb, Ta, Hf, Cd, Pr, Gd, Sm, Dy, Eu, Ho, Yb, Lu, Ce, Sn, K, Rb, and Cs.

If starting with a fired glass, one of ordinary skill in the art may calculate the percentages of starting components described herein using methods known to one of skill in the art including, but not limited to: Inductively Coupled Plasma-Emission Spectroscopy (ICP-ES), Inductively Coupled Plasma-Atomic Emission Spectroscopy (ICP-AES) and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); Cathodo-Luminescence (CL), X-ray Photoelectron Spectroscopy (XPS); X-ray Absorption Near Edge Structure (XANES); Auger electron spectroscopy (AES); Rutherford backscattering spectrometry (RBS).

One of ordinary skill in the art would recognize that the choice of raw materials could unintentionally include impurities that may be incorporated into the glass during processing. For example, the impurities may be present in the range of hundreds to thousands ppm. The presence of the impurities would not alter the properties of the glass, the thick-film composition, or the fired device. For example, a solar cell containing the thick-film composition may have the efficiency described herein, even if the thick-film composition includes impurities.

In the case where the Pb—Te-based oxides are in the form of a powder, there is no particular restriction on the size or shape of these powders. In an embodiment, the lead-containing powder may be a size and shape compatible with a particular deposition technique. For example, if the deposition technique is thick film screen printing using a 325 mesh screen, then the lead containing powder may be finely divided to −325 mesh so that the entirety of the thick film composition may pass through the 325 mesh screen and reliability transfer the desire pattern. Other deposition techniques utilizing powder may be envisioned including but not limited to, aerosol deposition, extrusion, nozzle printing, gravure, sol-gel and spray, with different associated particular particle size restrictions. In an embodiment, the lead containing powder is preferably less than the final film thickness (i.e. 10 microns), more preferable less than one-tenth the smallest dimension of the final printed line (so if 80 microns wide and 20 microns thick then <2 microns)

The median particle size of the Pb—Te-based oxide material in the present composition may be in the range of about 0.25 to 10 microns, or about 0.5 to 5 microns, or about 0.6 to 2 microns as measured using a Horiba LA-910 analyzer (HORIBA Instruments Inc., USA) or a Microtrac S3500 particle size analyzer (Microtrac, Inc., USA).

The Pb—Te-based oxides are listed with reference to particular embodiments; it is to be understood that these embodiments are merely illustrative of the principles and applications of the present invention. It will be apparent to those skilled in the part that various modifications and variations can be made to the method and apparatus of the present invention without departing from the spirit and scope of the invention.

Optional Oxide Additive

As noted above, an oxide may be included in the present paste composition as a discrete additive. This additive is selected from the group consisting of (i) one or more oxides of Al, Li, Na, K, Rb, Cs, Ti, V, Cr, Mn, Fe, Co, Ni, Cu, Zn, Zr, Nb, Si, Mo, Hf, Ag, Ga, Ge, In, Sn, Sb, Se, Ru, Bi, P and Y, (ii) one or more substances that form one or more of the above oxides upon heating and mixtures thereof. The oxide additive can be incorporated in the paste composition in a powder form as received from the supplier, or the powder can be ground or milled to a smaller average particle size. Particles of any size can be employed, as long as they can be incorporated into the present paste composition and provide its required functionality. In an embodiment, the paste composition comprises up to 5 wt % of the discrete oxide additive.

Any size-reduction method known to those skilled in the art can be employed to reduce particle size to a desired level. Such processes include, without limitation, ball milling, media milling, jet milling, vibratory milling, and the like, with or without a solvent present. If a solvent is used, water is the preferred solvent, but other solvents may be employed as well, such as alcohols, ketones, and aromatics. Surfactants may be added to the solvent to aid in the dispersion of the particles, if desired.

Organic Medium

The inorganic components of the thick-film paste composition are mixed with an organic medium to form viscous pastes having suitable consistency and rheology for printing. The mixture forms a viscous material referred to as a "paste"

or "ink." A wide variety of inert viscous materials can be used as the organic medium. The organic medium can be one in which the inorganic components are dispersible with an adequate degree of stability during manufacturing, shipping, and storage of the pastes, as well as on the printing screen during the screen-printing process.

A wide variety of inert materials can be admixed in an organic medium in the present composition including, without limitation, an inert, non-aqueous liquid that may or may not contain thickeners, binders, or stabilizers. By "inert" is meant a material that may be removed by a firing operation, i.e., volatilized, without leaving any substantial residue and that has no other effects detrimental to the paste or the final conductor line properties.

Suitable organic media have rheological properties that provide stable dispersion of solids, appropriate viscosity and thixotropy for screen printing, appropriate wettability of the substrate and the paste solids, a good drying rate, and good firing properties. The organic medium can be a solution of polymer(s) in solvent(s). Suitable polymers include ethyl cellulose, ethylhydroxyethyl cellulose, wood rosin, cellulose esters, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. A preferred ester alcohol is the monoisobutyrate of 2,2,4-trimethyl-1,3-pentanediol, which is available commercially from Eastman Chemical (Kingsport, Tenn.) as TEXANOL™. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate (DRAPEX® 4.4 from Witco Chemical), isotetradecanol, and pentaerythritol ester of hydrogenated rosin, Oxocol™ (isotetradecanol made by Nissan Chemical) and FORALYN™ 110 (pentaerythritol ester of hydrogenated rosin from Eastman Chemical). The organic medium can also include volatile liquids to promote rapid hardening after application of the thick-film paste composition on a substrate.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate and 0 to 1.0 weight percent dimethyl succinate based on total weight of dibasic ester.

The organic medium can contain thickeners, stabilizers, surfactants and/or other common additives. Such added surfactant may be included in the organic vehicle in addition to any surfactant included as a coating on the conductive metal powder of the paste composition. Suitable wetting agents include phosphate esters and soya lecithin. Both inorganic and organic thixotropes may also be present.

Among the commonly used organic thixotropic agents are hydrogenated castor oil and derivatives thereof, but other suitable agents may be used instead of, or in addition to, these substances. It is, of course, not always necessary to incorporate a thixotropic agent since the solvent and resin properties coupled with the shear thinning inherent in any suspension may alone be suitable in this regard.

The optimal amount of organic medium in the thick-film paste composition is dependent on the method of applying the paste and the specific organic medium used. Typically, the thick-film paste composition contains 70 to 95 wt % of inorganic components and 5 to 30 wt % of organic medium.

If the organic medium includes a polymer, the polymer may include 8 to 15 wt % of the organic composition.

The proportions of organic medium and inorganic components in the present paste composition can vary in accordance with the method of applying the paste and the kind of organic medium used. In an embodiment, the present paste composition typically contains about 50 to 95 wt %, 76 to 95 wt %, or 85 to 95 wt %, of the inorganic components and about 5 to 50 wt %, 5 to 24 wt %, or 5 to 15 wt %, of the organic medium, based on the total weight of the organic medium.

Formation of Conductive Structures

An aspect of the invention provides a process that may be used to form a conductive structure on a substrate. The process generally comprises the steps of providing the substrate, applying a paste composition, and firing the substrate. Ordinarily, the substrate is planar and relatively thin, thus defining first (front side) and second (back side) major surfaces on its opposite sides.

Preparation of the Thick-Film Paste Composition

In one embodiment, the thick-film paste composition can be prepared by mixing the electrically conductive metal powder, the Pb—Te-based oxide and the organic medium in any order. In some embodiments, the inorganic materials are mixed first, and they are then added to the organic medium. The viscosity can be adjusted, if needed, by the addition of one or more solvents. Mixing methods that provide high shear may be useful.

Application of Thick-Film Paste Composition

The thick-film paste composition can be applied as a paste onto a preselected portion of a major surface of the substrate in a variety of different configurations or patterns. The preselected portion may comprise any fraction of the total first major surface area, i.e., the front-side surface, including substantially all of the area. In an embodiment, the paste is applied on a semiconductor substrate, which may be single-crystal, cast mono, multi-crystal, polycrystalline, ribbon silicon or any other semiconductor material.

The application can be accomplished by a variety of deposition processes, including printing. Exemplary deposition processes include, without limitation, plating, extrusion or co-extrusion, dispensing from a syringe, and screen printing, inkjet, shaped, multiple, and ribbon printing. The paste composition ordinarily is applied over any insulating layer present on the first major surface of the substrate.

The conductive composition may be printed in any useful pattern. For example, the electrode pattern used for the front side of a photovoltaic cell commonly includes a plurality of narrow grid lines or fingers connected to one or more bus bars. In an embodiment, the width of the lines of the conductive fingers may be 20 to 200 µm; 40 to 150 µm; or 50 to 100 µm. In an embodiment, the thickness of the lines of the conductive fingers may be 5 to 50 µm; 10 to 35 µm; or 15 to 30 µm. Such a pattern permits the generated current to be extracted without undue resistive loss, while minimizing the area of the front side obscured by the metallization, which reduces the amount of incoming light energy that can be converted to electrical energy. The features of the electrode pattern should be well defined, with a preselected thickness and shape, and have high electrical conductivity and low contact resistance with the underlying structure.

Conductors formed by printing and firing a paste such as that provided herein are often called "thick film" conductors, since they are ordinarily substantially thicker than traces formed by atomistic processes, such as those used in fabricating integrated circuits. For example, thick film conductors may have a thickness after firing of about 1 to 100 µm.

Consequently, paste compositions that in their processed form provide conductivity and are suitably applied using printing processes are often called "thick film conductive pastes" or "conductive inks."

Firing

A firing operation is used in the present process to affect a substantially complete burnout of the organic medium from the deposited paste. The firing typically involves volatilization and/or pyrolysis of the organic materials. A drying operation optionally follows the printing step and precedes the firing operation, and is carried out at a modest temperature to harden the paste composition by removing its most volatile organics, e.g., the solvent.

The firing process is believed to remove the organic medium, sinter the conductive metal in the composition, and establish electrical contact between the semiconductor substrate and the fired conductive metal. Firing may be performed in an atmosphere composed of air, nitrogen, an inert gas, or an oxygen-containing mixture such as a mixed gas of oxygen and nitrogen.

In one embodiment, the temperature for the firing may be in the range between about 300° C. to about 1000° C., or about 300° C. to about 525° C., or about 300° C. to about 650° C., or about 650° C. to about 100° C., or about 750° C. to about 950° C., or about 750° C. to about 850° C. The firing may be conducted using any suitable heat source. In an embodiment, the firing is accomplished by passing the substrate bearing the printed paste composition pattern through a belt furnace at high transport rates, for example, between about 100 to about 600 cm per minute, with resulting hold-up times between about 0.01 to about 5 minutes. Multiple temperature zones may be used to control the desired thermal profile, and the number of zones may vary, for example, between 3 to 11 zones. The temperature of a firing operation conducted using a belt furnace is conventionally specified by the furnace set-point in the hottest zone of the furnace, but it is known that the peak temperature attained by the passing substrate in such a process is somewhat lower than the highest set-point. Other batch and continuous rapid fire furnace designs known to one of skill in the art are also contemplated.

In a further embodiment, prior to firing, other conductive and device enhancing materials are applied to the base region of the semiconductor device. The various materials may be applied and then co-fired, or they may be applied and fired sequentially.

Typically, the base is on the non-illuminated (back) side of the device, i.e., its second major surface. The materials serve as electrical contacts, passivating layers, and solderable tabbing areas. In an aspect of this embodiment, the back-side conductive material may contain aluminum. Suitable solderable tabbing materials include those containing aluminum and silver or only silver.

In a further embodiment, the present paste composition may be employed in the construction of semiconductor devices wherein the p and n regions are formed side-by-side in a substrate, instead of being respectively adjacent to opposite major surfaces of the substrate. In an implementation in this configuration, the electrode-forming materials may be applied on different portions of a single side of the substrate, e.g., on the non-illuminated (back) side of the device, thereby maximizing the amount of light incident on the illuminated (front) side.

Insulating Layer

In some embodiments of the invention, the paste composition is used in conjunction with a substrate, such as a semiconductor substrate, having one or more insulating layers present on one or more of the substrate's major surfaces. The one or more insulating layers are disposed onto at least the front-side surface of the silicon semiconductor substrate. The layer may comprise one or more components selected from aluminum oxide, titanium oxide, silicon nitride, $SiN_x$:H (silicon nitride containing hydrogen for passivation during subsequent firing processing), silicon oxide, and silicon oxide/titanium oxide, and may be in the form of a single, homogeneous layer or multiple sequential sub-layers of any of these materials. Silicon nitride and $SiN_x$:H are widely used.

The insulating layer provides the cell with an anti-reflective property, which lowers the cell's surface reflectance of light incident thereon, thereby improving the cell's utilization of the incident light and increasing the electrical current it can generate. Thus, the insulating layer is often denoted as an anti-reflective coating (ARC). The thickness of the layer preferably is chosen to maximize the anti-reflective property in accordance with the layer material's composition and refractive index. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present process optionally includes the step of forming the insulating layer on the semiconductor substrate prior to the application of the paste composition.

In some implementations of the present process, the paste composition is applied over any insulating layer present on the substrate, whether specifically applied or naturally occurring. The paste's fusible material and any additive present may act in concert to combine with, dissolve, or otherwise penetrate some or all of the thickness of any insulating layer material during firing. Preferably, good electrical contact between the paste composition and the underlying semiconductor substrate is thereby established. Ideally, the firing results in a secure contact and attachment of the conductive metal structure to the substrate, with a metallurgical bond being formed over substantially all the area of the substrate covered by the conductive element.

Firing promotes the formation of both good electrical conductivity in the conductive element itself and a low-resistance connection to the substrate, e.g., by sintering the conductive metal particles and etching through the insulating layer. While some embodiments may function with electrical contact that is limited to conductive domains dispersed over the printed area, it is preferred that the contact be uniform over substantially the entire printed area.

Structures

An embodiment of the present invention relates to a structure comprising a substrate and a conductive electrode, which may be formed by the process described above.

Semiconductor Device Manufacture

The structures described herein may be useful in the manufacture of semiconductor devices, including photovoltaic devices. An embodiment of the invention relates to a semiconductor device containing one or more structures described herein. Another embodiment relates to a photovoltaic device containing one or more structures described herein. Still further, there is provided a photovoltaic cell containing one or more structures described herein and a solar panel containing one or more of these structures.

In another aspect, the present invention relates to a device, such as an electrical, electronic, semiconductor, photodiode or photovoltaic device. Various embodiments of the device include a junction-bearing semiconductor substrate and one or more insulating layers, such as a silicon nitride layer, present on a first major surface of the substrate.

One possible sequence of steps implementing the present process for manufacture of a photovoltaic cell device is depicted by FIGS. 1A-1F.

Figure 1A:
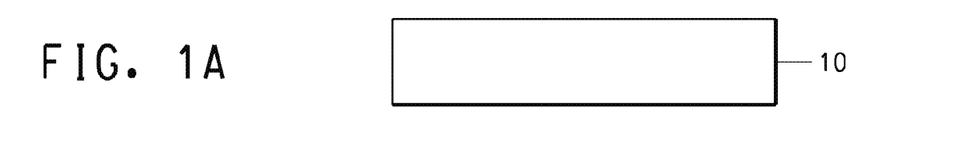

FIG. 1A shows a p-type substrate 10, which may be single-crystal, multi-crystalline or polycrystalline silicon. For example, substrate 10 may be obtained by slicing a thin layer from an ingot that has been formed from a pulling or casting process. Surface damage and contamination (from slicing with a wire saw, for example) may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, the substrate may be washed with a mixture of hydrochloric acid and optional hydrogen peroxide to remove heavy metals such as iron adhering to the substrate surface. Substrate 10 may have a first major surface 12 that is textured to reduce light reflection. Texturing may be produced by etching a major surface with an aqueous alkali solution such as aqueous potassium hydroxide or aqueous sodium hydroxide. Alkali texturing is particularly useful for single crystalline Si to create a random pyramid structure which gives a high degree of light trapping. Alternatively, acidic texturing solutions are often applied on multi-crystalline Si to create a light trapping surface texture. Substrate 10 may also be formed from a silicon ribbon.

Figure 1B:
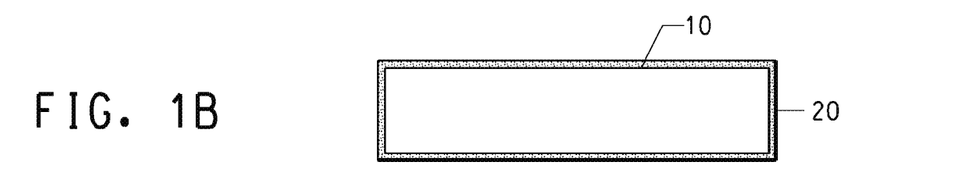

In FIG. 1B, an n-type diffusion layer 20 is formed to create a p-n junction with p-type material below. The n-type diffusion layer 20 can be formed by any suitable doping process, such as thermal diffusion of phosphorus (P) provided from phosphorus oxychloride ($POCl_3$) or ion implantation. In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.75 μm. The n-type diffusion layer may have a sheet resistivity from several tens of ohms per square up to about 120 ohms per square.

Figure 1C:
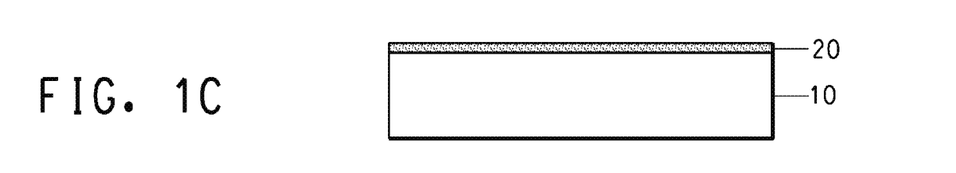

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
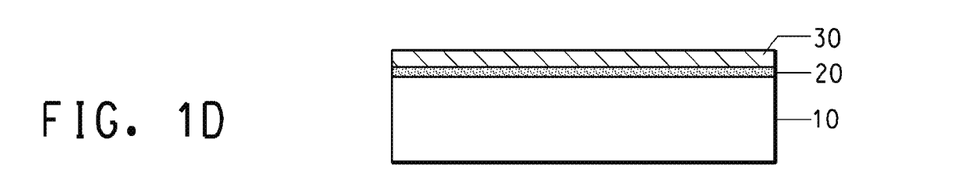

Next, as shown in FIG. 1D, an insulating layer 30, which also functions as an anti-reflective coating, is formed on the n-type diffusion layer 20. The insulating layer is commonly silicon nitride, but can also be a layer of another material, such as $SiN_x$:H (i.e., the insulating layer comprises hydrogen for passivation during subsequent firing processing), titanium oxide, silicon oxide, mixed silicon oxide/titanium oxide or aluminum oxide. The insulating layer can be in the form of a single layer or multiple layers of the same or different materials.

Figure 1E:
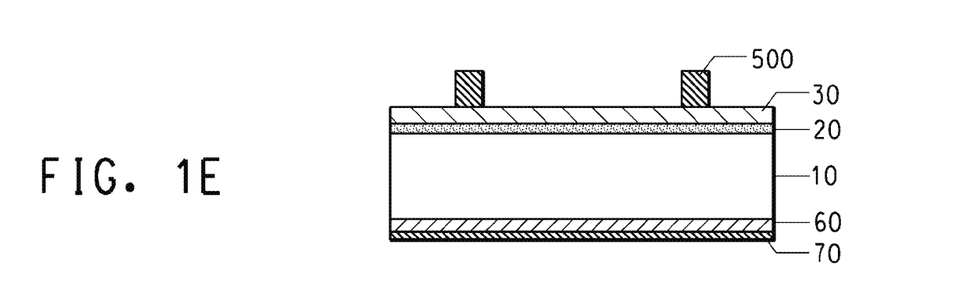

Next, electrodes are formed on both major surfaces 12 and 14 of the substrate. As shown in FIG. 1E, a paste composition 500 of this invention is screen printed on the insulating layer 30 of the first major surface 12 and then dried. For a photovoltaic cell, paste composition 500 is typically applied in a predetermined pattern of conductive lines extending from one or more bus bars that occupy a predetermined portion of the surface. In addition, aluminum paste 60 and back-side silver paste 70 are screen printed onto the back side (the second major surface 14 of the substrate) and successively dried. The screen printing operations may be carried out in any order. For the sake of production efficiency, all these pastes are typically processed by co-firing them at a temperature in the range of about 700° C. to about 975° C. for a period of from several seconds to several tens of minutes in air or an oxygen-containing atmosphere. An infrared-heated belt furnace is conveniently used for high throughput.

Figure 1F:
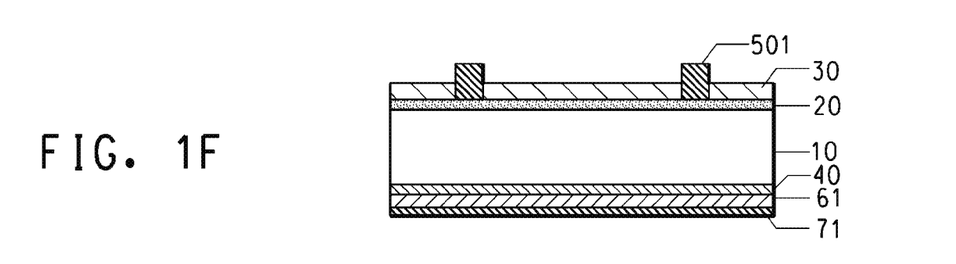

As shown in FIG. 1F, the firing causes the depicted paste composition 500 on the front side to sinter and penetrate through the insulating layer 30, thereby achieving electrical contact with the n-type diffusion layer 20, a condition known as "fire through." This fired-through state, i.e., the extent to which the paste reacts with and passes through the insulating layer 30, depends on the quality and thickness of the insulating layer 30, the composition of the paste, and on the firing conditions. A high-quality fired-through state is believed to be an important factor in obtaining high conversion efficiency in a photovoltaic cell. Firing thus converts paste 500 into electrode 501, as shown in FIG. 1F.

The firing further causes aluminum to diffuse from the back-side aluminum paste into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, a silver or silver/aluminum back electrode is formed on limited areas of the back side as an electrode to permit soldered attachment of interconnecting copper ribbons or the like.

While the present invention is not limited by any particular theory of operation, it is believed that, upon firing, the Pb—Te-based oxide with any additive component present acting in concert, promotes rapid penetration of the insulating layer conventionally used on the front side of a photovoltaic cell. Efficient penetration in turn permits the formation of a low resistance, front-side electrical contact between the metal(s) of the composition and the underlying substrate.

It will be understood that the present paste composition and process may also be used to form electrodes, including a front-side electrode, of a photovoltaic cell in which the p- and n-type layers are reversed from the construction shown in FIGS. 1A-1F, so that the substrate is n-type and a p-type material is formed on the front side.

In yet another embodiment, this invention provides a semiconductor device that comprises a semiconductor substrate having a first major surface; an insulating layer optionally present on the first major surface of the substrate; and, disposed on the first major surface, a conductive electrode pattern having a preselected configuration and formed by firing a paste composition as described above.

A semiconductor device fabricated as described above may be incorporated into a photovoltaic cell. In another embodiment, this invention thus provides a photovoltaic cell array that includes a plurality of the semiconductor devices as described, and made as described, herein.

Lightly Doped Emitter (LDE) Wafers

Si solar cells are made by adding controlled impurities (called dopants) to purified Si. Different dopants impart positive (p-type) and negative (n-type) semiconducting properties to the Si. The boundary (junction) between the p-type and n-type Si has an associated (built-in) voltage that provides power to electrical charge carriers in the solar cell. Dopant concentration must be controlled to achieve optimal cell performance. High dopant concentration imparts low electrical resistivity within the Si and at the Si surface (to metal contacts) decreasing resistance losses. It also introduces crystalline defects or electrical perturbations in the Si lattice that increase recombination losses.

The most common Si solar cell design consists of a 200 micron thick p-type Si wafer coated with a 0.4 micron layer n-type Si. The p-type wafer is the base. The n-type layer is the emitter and is made by either diffusion or ion implantation of phosphorous (P) dopant into the Si wafer. Emitters made with low dopant concentration at the wafer surface are called lightly (or lowly) doped emitters.

The lightly doped emitter (LDE) improves solar cell performance by decreasing electron-hole recombination at the front surface. The concentration of P dopant at the front surface ($[P_{surface}]$) above $\sim 1 \times 10^{20}$ atoms/cm$^3$ in Si leads to various types of recombination. Recombined charge carriers are bound to the Si lattice and unable to be collected as electrical energy. The solar cell energy loss results from a decrease of both $V_{OC}$ (open circuit voltage) and $I_{SC}$ (short circuit current).

Typical highly doped Si emitters (HDE) have total $[P_{surface}]$ ranging from 9 to $15 \times 10^{20}$ atoms/cm$^3$ and active $[P_{surface}]$ ranging from 3 to $4 \times 10^{20}$ atoms/cm$^3$. Lightly doped emitters have total $[P_{surface}]$ ranging from 0.9 to $2.9 \times 10^{20}$ atoms/cm$^3$ and active $[P_{surface}]$ ranging from 0.6 to $2.0 \times 10^{20}$ atoms/cm$^3$. P dopant in excess of the active concentration (inactive P) leads to Shockley-Read-Hall (SRH) recombination energy loss. Active P dopant above $1 \times 10^{20}$ atoms/cm$^3$ leads to Auger recombination energy loss.

Total dopant concentration is typically measured using the SIMS (secondary ion mass spectrometry) depth profiling method. [Diffusion in Silicon, S. W. Jones, IC Knowledge LLC 2008 pages 56-62, see page 61] Active dopant concentration is often measured using SRP (spreading resistance probing) [Diffusion in Silicon, op. cit., page 61] or ECV (electrochemical capacitance voltage [Diffusion in Silicon, op. cit., page 57]methods.

Metal contacts to lightly doped emitters have larger energy barriers to charge carrier tunneling than contacts to highly doped emitters. The larger barriers decrease tunneling current and increase contact resistivity. The high contact resistance to LDE is decreased by increasing contact area with improved interfacial film structures at the silicon-metal contact region.

Industrially prepared wafers for solar cell use typically have high surface [P] emitters, as discussed above, that degrades short wavelength response and result in lower $V_{OC}$ and $J_{SC}$. The reason for the use of high surface [P] emitters is to enable low contact resistivity metallization contacts, without which contact is poor and cell performance degrades. Thick film metallization pastes that can contact lightly doped, low surface [P] emitters without damaging the emitter layer surface will enable screen-printed crystalline silicon solar cells to have reduced saturation current density at the front surface ($J_{0e}$) and accompanying increased $V_{OC}$ and $J_{SC}$, and therefore improved solar cell performance.

EXAMPLES

Illustrative preparations and evaluations of thick-film paste compositions are described below. The operation and effects of certain embodiments of the present invention may be more fully appreciated from a series of examples described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Preparation of the Pb—Te-Based Oxide Compositions in Table 1

The lead-tellurium-based oxide (Pb—Te-based oxide) compositions of Table 1 were prepared by mixing and blending one or more of $Pb_3O_4$, PbO, $PbO_2$, $TeO_2$, $Li_2O$, $Li_2CO_3$, $Bi_2O_3$, $Na_2O$, $Na_2CO_3$, $Cr_2O_3$, $H_3BO_3$, or $B_2O_3$ based on the final compositions listed in Table 1. The blended powder batch materials were loaded into a platinum alloy crucible and then inserted into a furnace at 900-1000° C. using an air- or $O_2$-containing atmosphere. The duration of the heat treatment was 20 minutes following the attainment of a full solution of the constituents. The resulting low viscosity liquid resulting from the fusion of the constituents was then quenched by metal roller. The quenched glass was then milled, and screened to provide a powder with a $D_{50}$ of 0.1 to 3.0 microns.

TABLE 1

Pb—Te-based oxide compositions in weight percent

| Glass # | PbO | $B_2O_3$ | $Na_2O$ | $Li_2O$ | $Bi_2O3$ | $Cr_2O_3$ | $TeO_2$ |
|---|---|---|---|---|---|---|---|
| 1 | 44.36 | 0.49 | 0 | 0.78 | 6.79 | 0 | 47.58 |
| 2 | 44.19 | 0.49 | 0.72 | 0.43 | 6.77 | 0 | 47.40 |
| 3 | 44.42 | 0.49 | 0.40 | 0.24 | 6.80 | 0 | 47.64 |
| 4 | 44.31 | 0.51 | 0.56 | 0.34 | 6.76 | 0 | 47.53 |
| 5 | 49.12 | 0.50 | 0.35 | 0.43 | 6.66 | 0 | 42.93 |
| 6 | 44.44 | 0.51 | 0 | 0.61 | 6.78 | 0 | 47.67 |
| 7 | 44.25 | 0.50 | 0.46 | 0.56 | 6.75 | 0 | 47.47 |
| 8 | 44.45 | 0.51 | 0.26 | 0.31 | 6.78 | 0 | 47.68 |
| 9 | 44.35 | 0.51 | 0.36 | 0.43 | 6.77 | 0 | 47.58 |
| 10 | 43.69 | 0.52 | 0.46 | 0.44 | 6.91 | 1.13 | 46.86 |

Note:
the compositions in the table are displayed as weight percent, based on the weight of the total glass composition.

Paste Preparation of the Pb—Te-Based Oxides of Table 1

In general, pastes for Table 3 were prepared using the following procedure. The appropriate amount of solvent, binders, and surfactant from Table 2 were weighed and put into a plastic jar. Then they were mixed until all ingredients were well blended.

TABLE 2

| Component | Wt. % |
|---|---|
| 2,2,4-trimethyl-1,3-pentanedial monoisobutyrate | 48.46% |
| Ethyl Cellulose (50-52% ethoxyl) | 0.10% |
| Ethyl Cellulose (48-50% ethoxyl) | 0.05% |
| N-tallow-1,3-diaminopropane dioleate | 11.11% |
| Hydrogenated castor oil | 5.56% |
| Pentaerythritol tetraester of perhydroabietic acid | 6.94% |
| Dimethyl adipate | 25.00% |
| Dimethyl glutarate | 2.78% |

To make the final pastes of Table 3 two separate pastes were made by A) incrementally adding an appropriate amount of Ag to an appropriate amount of the medium of Table 2 and hand mixing, and B) adding an appropriate amount of Pb—Te-based oxide from Table 1 to an appropriate amount of the medium of Table 2 and hand mixing. The A and B pastes were formulated to the same percentage of solids on a volumetric basis so that all the final pastes of Table 3 have a similar percentage of solids on a weight basis in the range of 89.8 wt % to 90.1 wt %.

After all ingredients were well mixed by hand or table mixer, the paste was put into a planetary centrifugal mixer (Thinky Corporation, Tokyo, Japan) for 0.5-2 min at 1000 rpm, in a process termed here as "Thinky mixing". The paste is then repeatedly passed through a 3-roll mill at progressively increasing pressures from 0 to 250 psi. The gap of the rolls was set to 2 mils. The degree of dispersion was measured by fineness of grind (FOG). A typical FOG value for a paste is less than 10 microns for the fourth longest, continuous scratch and less than 5 microns for the point at which 50% of the paste is scratched; the FOG result for these values is displayed as "10/5".

Appropriate amounts of the Ag paste and the Pb—Te-based oxide paste were Thinky mixed together to result in the final paste compositions shown in Table 3. The final paste viscosity was measured using a Brookfield viscometer (Brookfield, Inc., Middleboro, Mass.) with a #14 spindle and a #6 cup. The viscosity of the paste was measured after 12-24 hrs at room temperature. Viscosity was measured after 3 minutes at 10 RPM in a viscometer and the paste viscosity was adjusted to between 280 to 320 Pa's by adding solvent and, optionally binder, and then Thinky mixing. This step was repeated until the desired viscosity was achieved. The FOG was measured on the final paste to be better than 10/5. The final pastes were also tested for percentage of solids, typically in the range of 89.8% to 90.1%.

The paste examples of Table 3 were made using the procedure described above for making the paste compositions listed in Table 3 according to the following details.

Solar Cell Preparation of the Examples in Table 3

Solar cells for testing the performance of the thick-film paste in Table 3 were made from 180 micron p-type monocrystalline silicon wafers with a 70-75Ω/□ phosphorous-doped n-type lightly doped emitter (LDE) layer. These monocrystalline wafers were obtained from DuPont Innovalight, Sunnyvale, Calif. The solar cells used were textured by pyramidal acid etching and had an anti-reflection coating (ARC) of $SiN_x$:H. Wafers of 6 inch square were cut down to 2.8 cm square using a laser scribing tool from OpTek System, UK. After separation, all chips were measured for surface resistance using a 4-point probe and all chips with <65Ω/□ were removed and remaining chips randomized.

For the examples in Table 3, each sample was made by screen-printing using an AMI Presco MSP-885 printer set with a squeegee speed of 100-150 mm/sec. The screen used for 2.8 cm square had a pattern of 11 finger lines with a 70 micron opening (the actual opening measured by optical microscopy inspection was 65 microns). All patterns had a single bus bar with a 1.5 mm opening on a 20 µm emulsion in a screen with 325 mesh and 23 µm wires. An experimental Al paste was printed on the non-illuminated (back) side of the device.

The device with the printed patterns was dried for 10-15 minutes in a drying oven with a 150° C. peak temperature after each side is printed. The substrates were then fired front-side up with a CF7214 Despatch 6-zone IR furnace using a 560 cm/min belt speed; the first five zones were set to 500-550-610-700-800 and the sixth zone was set to the temperatures indicated in Table 3. The actual temperature of the part was measured during processing. The estimated peak temperature of each part was 770-830° C. and each part was above 650° C. for a total time of 4-6 seconds. The fully processed samples were then tested for PV performance using a calibrated ST-1000 tester.

Efficiency (Eff %), fill factor (FF), series resistance (Rs), and open circuit voltage ($V_{OC}$) were measured for each sample, as shown in Table 3. For each paste, the median values of the efficiency, fill factor, and series resistance for 10 samples are shown.

Test Procedure: Efficiency for Table 3

The solar cells built according to the method described herein were tested for conversion efficiency. An exemplary method of testing efficiency is provided below.

The solar cells built according to the method described above and displayed in Table 3 were measured in a commercial I-V tester at 25+/−1.0° C. using a ST-1000 IV tester (Telecom STV Co., Moscow, Russia). The Xe arc lamp in the I-V tester simulated the sunlight with a known intensity, AM 1.5, and irradiated the front surface of the cell. The tester used a four contact method to measure current (I) and voltage (V) at approximately 400 load resistance settings to determine the cell's I-V curve. Both fill factor (FF), efficiency (Eff) and series resistance (Rs) were calculated from the I-V curve and $V_{OC}$ measured as the voltage at zero current (open circuit condition). Series resistance is defined in a conventional manner as the negative of the reciprocal of the local slope of the IV curve near the open circuit voltage condition. Ideality factor was determined using the Suns-VOC technique by assumine a two-diode model (Suns-VOC data not shown). Measurements were made on samples fired at the three peak firing temperatures of 930° C., 945° C. and 960° C. as shown in Table 3. Of course, this testing protocol is exemplary, and other equipment and procedures for testing efficiency will be recognized by one of ordinary skill in the art.

TABLE 3

Eff %, FF, Rs, & $V_{OC}$ of paste using select Pb—Te-based oxides of Table 1 on single-crystalline LDE solar cells.

| | | Wt % | Eff (%) | | | FF (%) | | | Rs (Ω * cm2) | | | Voc (mV) | | |
|---|---|---|---|---|---|---|---|---|---|---|---|---|---|---|
| Exam # | Glass # | oxide | 930 | 945 | 960 | 930 | 945 | 960 | 930 | 945 | 960 | 930 | 945 | 960 |
| 1 | 2 | 2 | 15.67 | 15.77 | 15.61 | 72.8 | 73.3 | 72.9 | 1.505 | 1.428 | 1.432 | 622.0 | 622.0 | 620.5 |
| 2 | 3 | 2 | 15.56 | 15.59 | 15.53 | 72.5 | 72.5 | 72.9 | 1.574 | 1.467 | 1.443 | 621.2 | 621.8 | 620.7 |
| 3 | 1 | 2 | 15.11 | 15.51 | 15.49 | 70.9 | 71.5 | 72.5 | 1.831 | 1.586 | 1.523 | 620.0 | 621.5 | 621.0 |
| 4 | 9 | 2 | 16.33 | 16.39 | 16.56 | 76.2 | 76.7 | 77.0 | 1.412 | 1.346 | 1.324 | 626.0 | 627.0 | 626.5 |
| 5 | 4 | 2 | 15.53 | 15.88 | 16.15 | 72.3 | 74.0 | 75.0 | 1.768 | 1.539 | 1.368 | 623.8 | 624.0 | 624.0 |
| 6 | 5 | 2 | 15.66 | 16.16 | 16.17 | 73.5 | 74.9 | 75.2 | 1.635 | 1.460 | 1.444 | 625.0 | 626.3 | 626.2 |
| 7 | 6 | 2 | 15.03 | 15.47 | 16.07 | 70.8 | 73.1 | 74.4 | 2.034 | 1.570 | 1.455 | 619.0 | 620.2 | 624.0 |
| 8 | 7 | 2 | 15.93 | 16.24 | 16.41 | 75.3 | 76.4 | 76.3 | 1.467 | 1.355 | 1.330 | 625.0 | 625.8 | 626.0 |
| 9 | 8 | 2 | 15.46 | 15.90 | 15.97 | 72.8 | 74.5 | 74.3 | 1.633 | 1.483 | 1.442 | 622.0 | 624.5 | 624.5 |

Paste Preparation of the Pb—Te-Based Oxides of Table 4

Mixtures of $Pb_3O_4$, PbO, $PbO_2$, $TeO_2$, $Li_2O$, $Li_2CO_3$, $Bi_2O_3$, $Na_2O$, $Na_2CO_3$, $Cr_2O_3$, $TiO_2$, $Ag_2O$, $AgNO_3$, NiO, $Fe_2O_3$, FeO, $RuO_2$, CuO, $Cu_2O$, $Al_2O_3$, $SiO_2$, $H_3BO_3$, or $B_2O_3$ as shown in the final compositions listed in Table 4 were tumbled in a suitable container for 15 to 30 minutes to mix the starting powders. The starting powder mixture was placed in a covered platinum crucible and heated in air at a heating rate of 10° C./min to 900° C. and then held at 900° C. for one hour to melt the mixture. Each melt was separately quenched by pouring onto the flat surface of a cylindrically-shaped stainless steel block (8 cm high, 10 cm in diameter). The cooled buttons were pulverized to a −100 mesh coarse powder.

Then the coarse powder was ball milled in a polyethylene container with zirconia media and a suitable liquid, such as water, isopropyl alcohol, or water containing 0.5 wt. % TRITON™ X-100 octylphenol ethoxylate surfactant (available from Dow Chemical Company, Midland, Mich.) until the $D_{50}$ was in the range of 0.5 to 2 μm. The ball-milled material was then separated from the milling balls, dried, and run through a 230 mesh screen to provide the powders used in the thick-film paste preparations.

TABLE 4

Pb—Te-Based Oxide Compositions in Weight Percent

| Glass # | $SiO_2$ | $Al_2O_3$ | PbO | $B_2O_3$ | CuO | $Na_2O$ | $Li_2O$ | $Bi_2O_3$ | $TiO_2$ | $Ag_2O$ | $Cr_2O_3$ | NiO | $Fe_2O_3$ | $RuO_2$ | $TeO_2$ | Total |
|---|---|---|---|---|---|---|---|---|---|---|---|---|---|---|---|---|
| 11 | 0 | 0 | 51.91 | 4.63 | 0 | 1.04 | 0 | 0 | 0 | 0 | 0 | 0 | 0 | 0 | 42.42 | 100 |
| 12 | 0 | 0 | 51.32 | 4.58 | 0 | 2.15 | 0 | 0 | 0 | 0 | 0 | 0 | 0 | 0 | 41.95 | 100 |
| 13 | 0 | 0 | 42.56 | 0 | 0 | 0.89 | 0 | 0 | 0 | 0 | 0 | 0 | 0 | 0 | 56.54 | 100 |
| 14 | 0 | 0 | 42.15 | 0 | 0 | 1.86 | 0 | 0 | 0 | 0 | 0 | 0 | 0 | 0 | 55.99 | 100 |
| 15 | 0 | 0 | 42.37 | 0 | 0 | 0.93 | 0.45 | 0 | 0 | 0 | 0 | 0 | 0 | 0 | 56.25 | 100 |
| 16 | 0 | 0 | 46.44 | 0.51 | 0.46 | 0.18 | 0.44 | 0 | 0.71 | 0 | 0 | 0 | 0 | 0 | 51.24 | 100 |
| 17 | 0 | 0 | 45.77 | 0 | 0 | 0 | 0.44 | 0 | 0 | 0 | 1.15 | 0 | 1.17 | 0 | 51.48 | 100 |
| 18 | 0 | 0 | 39.52 | 0.45 | 0 | 0.33 | 1.01 | 6.02 | 0 | 7.54 | 0 | 0 | 0 | 2.76 | 42.37 | 100 |
| 19 | 0 | 0 | 40.89 | 0.46 | 0 | 0.35 | 0.40 | 6.24 | 0 | 7.81 | 0 | 0 | 0 | 0 | 43.85 | 100 |
| 20 | 0 | 0 | 40.52 | 0.49 | 0 | 0.43 | 0.41 | 6.41 | 0 | 7.21 | 1.05 | 0 | 0 | 0 | 43.47 | 100 |
| 21 | 0 | 0 | 46.96 | 0 | 0 | 0 | 0.44 | 0 | 0 | 0 | 2.22 | 0 | 0 | 0 | 50.38 | 100 |
| 22 | 0 | 0 | 45.14 | 0.50 | 0 | 0 | 0.43 | 6.72 | 0 | 0 | 1.10 | 0 | 0 | 0 | 46.11 | 100 |
| 23 | 0 | 0 | 44.38 | 0 | 0 | 0.39 | 0.93 | 4.34 | 0 | 0 | 2.36 | 0 | 0 | 0 | 47.60 | 100 |
| 24 | 0 | 0 | 42.99 | 0 | 0 | 1.87 | 0.18 | 7.71 | 0 | 0 | 1.14 | 0 | 0 | 0 | 46.11 | 100 |
| 25 | 0 | 0 | 43.07 | 1.05 | 0 | 0.98 | 0.18 | 7.38 | 0 | 0 | 1.15 | 0 | 0 | 0 | 46.20 | 100 |
| 26 | 0 | 0 | 43.31 | 0.32 | 0 | 0.85 | 0.41 | 6.36 | 0 | 0 | 2.30 | 0 | 0 | 0 | 46.46 | 100 |
| 27 | 0 | 0 | 42.40 | 1.03 | 0 | 0.37 | 0.18 | 8.30 | 0 | 0 | 2.26 | 0 | 0 | 0 | 45.47 | 100 |
| 28 | 0 | 0 | 42.07 | 0 | 0 | 0.37 | 0.68 | 10.64 | 0 | 0 | 1.12 | 0 | 0 | 0 | 45.13 | 100 |
| 29 | 0 | 0 | 45.23 | 0.77 | 0 | 0.39 | 0.95 | 2.95 | 0 | 0 | 1.20 | 0 | 0 | 0 | 48.51 | 100 |
| 30 | 0 | 0 | 40.73 | 0.69 | 0 | 0.35 | 0.17 | 13.29 | 0 | 0 | 1.08 | 0 | 0 | 0 | 43.69 | 100 |
| 31 | 0 | 0 | 40.76 | 0 | 0 | 0.97 | 0.17 | 13.30 | 0 | 0 | 1.08 | 0 | 0 | 0 | 43.72 | 100 |
| 32 | 0 | 0 | 40.52 | 0 | 0 | 0.44 | 0.21 | 13.22 | 0 | 0 | 2.16 | 0 | 0 | 0 | 43.46 | 100 |
| 33 | 0 | 0 | 45.10 | 0 | 0 | 0.83 | 0.94 | 2.94 | 0 | 0 | 1.80 | 0 | 0 | 0 | 48.38 | 100 |
| 34 | 0 | 0 | 45.16 | 0 | 0 | 1.52 | 0.73 | 2.95 | 0 | 0 | 1.20 | 0 | 0 | 0 | 48.44 | 100 |
| 35 | 0 | 0 | 44.38 | 0 | 0 | 0.39 | 0.93 | 4.34 | 0 | 0 | 2.36 | 0 | 0 | 0 | 47.60 | 100 |
| 36 | 0 | 0 | 42.99 | 0 | 0 | 1.87 | 0.18 | 7.71 | 0 | 0 | 1.14 | 0 | 0 | 0 | 46.11 | 100 |
| 37 | 7.01 | 3.96 | 0 | 3.38 | 0 | 0 | 0 | 83.05 | 0 | 0 | 2.59 | 0 | 0 | 0 | 0.00 | 100 |
| 38 | 7.10 | 4.02 | 0 | 3.43 | 0 | 0 | 0 | 84.17 | 0 | 0 | 1.28 | 0 | 0 | 0 | 0.00 | 100 |
| 39 | 0 | 0 | 43.03 | 0.52 | 0 | 0.47 | 0.45 | 7.02 | 0 | 0 | 1.14 | 0 | 1.20 | 0 | 46.16 | 100 |
| 40 | 0 | 0 | 43.07 | 0.52 | 0 | 0.47 | 0.45 | 7.02 | 0 | 0 | 1.15 | 1.13 | 0 | 0 | 46.19 | 100 |
| 41 | 0 | 0 | 43.66 | 0.52 | 0 | 0.46 | 0.44 | 6.91 | 0 | 0 | 0 | 0 | 1.18 | 0 | 46.83 | 100 |
| 42 | 0 | 0 | 43.69 | 0.52 | 0 | 0.46 | 0.44 | 6.91 | 0 | 0 | 0 | 1.11 | 0 | 0 | 46.87 | 100 |
| 43 | 0 | 0 | 43.69 | 0.52 | 0 | 0.46 | 0.44 | 6.91 | 0 | 0 | 1.13 | 0 | 0 | 0 | 46.86 | 100 |
| 44 | 0 | 0 | 43.80 | 0.54 | 0 | 0.57 | 0.92 | 7.19 | 0 | 0 | 0 | 0 | 0 | 0 | 46.98 | 100 |
| 45 | 0 | 0 | 43.87 | 0.53 | 0 | 0.48 | 0.92 | 7.15 | 0 | 0 | 0 | 0 | 0 | 0 | 47.05 | 100 |
| 46 | 0 | 0 | 43.93 | 0.53 | 0 | 0.38 | 0.91 | 7.12 | 0 | 0 | 0 | 0 | 0 | 0 | 47.12 | 100 |
| 47 | 0 | 0 | 44.23 | 0.51 | 0 | 0.55 | 0.44 | 6.83 | 0 | 0 | 0 | 0 | 0 | 0 | 47.44 | 100 |
| 48 | 0 | 0 | 44.29 | 0.51 | 0 | 0.45 | 0.44 | 6.80 | 0 | 0 | 0 | 0 | 0 | 0 | 47.51 | 100 |
| 49 | 0 | 0.61 | 0 | 3.12 | 0 | 0.92 | 0.45 | 80.62 | 0 | 0 | 0 | 0 | 0 | 0 | 14.28 | 100 |
| 50 | 4.85 | 0.66 | 2.40 | 3.37 | 0 | 1.00 | 0.48 | 84.67 | 0 | 0 | 0 | 0 | 0 | 0 | 2.57 | 100 |
| 51 | 3.82 | 0.65 | 4.72 | 3.32 | 0 | 0.98 | 0.47 | 80.96 | 0 | 0 | 0 | 0 | 0 | 0 | 5.07 | 100 |
| 52 | 1.85 | 0.63 | 9.19 | 3.22 | 0 | 0.96 | 0.46 | 73.83 | 0 | 0 | 0 | 0 | 0 | 0 | 9.85 | 100 |
| 53 | 0 | 0 | 53.75 | 0.49 | 0 | 0.35 | 0.42 | 6.56 | 0 | 0 | 0 | 0 | 0 | 0 | 38.43 | 100 |

Note:
the compositions in the table are displayed as weight percent, based on the weight of the total glass composition.

Paste Preparation of the Pb—Te-Based Oxides of Table 4

In accordance with an aspect of the invention, Pb—Te-based oxides of Table 4 were formulated in paste compositions suitable for screen printing. The pastes, before adjusting their viscosities with additional solvent, consisted of approximately 9.7 wt % medium and 2 to 6 wt % lead-tellurium-based oxide, with the remainder being silver powder.

The organic medium was prepared as a master batch using a Thinky mixer to mix the ingredients listed in Table 5 below, with percentages given by weight.

TABLE 5

Organic Medium Composition for the Paste of Table 6

| Component | Wt. % |
|---|---|
| 2,2,4-trimethyl-1,3-pentanediol monoisobutyrate | 39.32% |
| Ethyl Cellulose (50-52% ethoxyl) | 0.17% |
| Ethyl Cellulose (48-50% ethoxyl) | 0.03% |
| N-tallow-1,3-diaminopropane dioleate | 10.75% |

TABLE 5-continued

Organic Medium Composition for the Paste of Table 6

| Component | Wt. % |
|---|---|
| Hydrogenated castor oil | 5.38% |
| Pentaerythritol tetraester of perhydroabietic acid | 6.72% |
| Dimethyl adipate | 33.87% |
| Dimethyl glutarate | 3.76% |

For each paste, a suitable small portion of TEXANOL™ was added after three-roll milling to adjust the final viscosity to a level permitting the composition to be screen printed onto a substrate. Typically, a viscosity of about 300 Pa-s was found to yield good screen printing results, but some variation, for example ±50 Pa-s or more would be acceptable, depending on the precise printing parameters.

Silver powder, represented by the manufacturer as having a predominantly spherical shape and having a particle size distribution with a $D_{50}$ of about 2.3 μm (as measured in an isopropyl alcohol dispersion using a Horiba LA-910 analyzer), was combined with the milled Pb—Te-based oxide in a glass jar and tumble mixed for 15 minutes. The inorganic mixture was then added by thirds to a Thinky jar containing the organic ingredients and Thinky-mixed for 1 minute at 2000 RPM after each addition. After the final addition, the paste was cooled and the viscosity was adjusted to between about 300 and 400 Pa-s by adding solvent and Thinky mixing for 1 minute at 2000 RPM. The paste was then milled on a three-roll mill (Charles Ross and Son, Hauppauge, N.Y.) with a 25 μm gap for 3 passes at zero pressure and 3 passes at 100 psi (689 kPa).

Each paste composition was allowed to sit for at least 16 hours after roll milling, and then its viscosity was adjusted to ~300 Pa-s with additional solvent to render it suitable for screen printing. The viscometer was a Brookfield viscometer (Brookfield Inc., Middleboro, Mass.) with a #14 spindle and a #6 cup. Viscosity values were taken after 3 minutes at 10 RPM.

Cell Fabrication for Table 6

Photovoltaic cells were fabricated in accordance with an aspect of the invention using the paste compositions of Table 6 to form the front-side electrodes for the cells of Table 6, respectively. The amount of Pb—Te-based oxide (in wt % based on the total paste composition) in each example is listed in Table 6 below.

180 micron p-type mono-crystalline silicon wafers with a 70-75Ω/☐ phosphorous-doped n-type lightly doped emitter (LDE) layer were used for fabrication and electrical testing. Those mono-crystalline wafers were obtained from DuPont Innovalight, Sunnyvale, Calif. For convenience, the experiments were carried out using 28 mm×28 mm "cut down" wafers prepared by dicing 156 mm×156 mm starting wafers using a diamond wafering saw. The sheet resistance of each cut-down wafer was checked using a four-point probe and those not in the range of 70 to 75Ω/☐ were not used for these tests. The test wafers were screen printed using an AMI-Presco (AMI, North Branch, N.J.) MSP-485 screen printer, first to form a full ground plane back-side conductor using a conventional Al-containing paste, SOLAMET® PV381 (available from DuPont, Wilmington, Del.), and thereafter to form a bus bar and eleven or thirteen conductor lines at a 0.254 cm or 0.210 cm pitch on the front surface using the various exemplary paste compositions herein. After printing and drying, cells were fired in a BTU rapid thermal processing, multi-zone belt furnace (BTU International, North Billerica, Mass.). A minimum of four cells were fired at the optimal firing temperature (given in Table 6) for each paste. After firing, the median conductor line width was 90-110 μm and the mean line height was 15 μm. The bus bar was 1.25 mm wide. The median line resistivity was 3.0 μΩ-cm. Performance of "cut-down" 28 mm×28 mm cells is known to be impacted by edge effects which reduce the overall photovoltaic cell efficiency by ~5% from what would be obtained with full-size wafers.

Electrical Testing for Table 6

Electrical properties of photovoltaic cells as thus fabricated using the paste compositions Table 6 were measured at 25±1.0° C. using an ST-1000 IV tester (Telecom STV Co., Moscow, Russia). The Xe arc lamp in the IV tester simulated sunlight with a known intensity and irradiated the front surface of the cell. The tester used a four contact method to measure current (I) and voltage (V) at approximately 400 load resistance settings to determine the cell's I-V curve. Efficiency, fill factor (FF), and series resistance ($R_a$) were obtained from the I-V curve for each cell. $R_a$ is defined in a conventional manner as the negative of the reciprocal of the local slope of the IV curve near the open circuit voltage. As recognized by a person of ordinary skill, $R_a$ is conveniently determined and a close approximation for $R_s$, the true series resistance of the cell. For each composition, an optimum firing temperature was identified as the temperature that resulted in the highest median efficiency, based on the 5-cell test group for each composition and temperature. Electrical results for the cell groups fired at the respective optimal firing temperature are depicted in Table 6 below. Of course, this testing protocol is exemplary, and other equipment and procedures for testing efficiencies will be recognized by one of ordinary skill in the art.

TABLE 6

Eff %, FF, & $R_a$ of paste using select Pb—Te-based oxides of Table 4 on Single-Crystalline LDE Solar Cells

| Example # | Glass # | wt % Pb—Te-based oxide of Table 4 | Peak Firing Temp. (° C.) | Eff (%) | FF (%) | $R_a$ (Ω * cm²) |
|---|---|---|---|---|---|---|
| 10 | 9 | 2.00 | 930 | 15.98 | 72.5 | 1.427 |
| 11 | 10 | 2.00 | 930 | 16.35 | 73.5 | 1.429 |
| 12 | 18 | 2.24 | 930 | 16.41 | 73.4 | 1.418 |
| 13 | 19 | 2.18 | 930 | 16.18 | 72.9 | 1.486 |
| 14 | 20 | 2.00 | 930 | 16.18 | 72.5 | 1.539 |
| 15 | 23 | 2.00 | 930 | 16.34 | 73.5 | 1.444 |
| 16 | 24 | 2.00 | 930 | 15.63 | 71.5 | 1.664 |
| 17 | 25 | 2.00 | 930 | 13.86 | 63.3 | 2.979 |
| 18 | 26 | 2.00 | 910 | 15.95 | 72.5 | 1.555 |
| 19 | 27 | 2.00 | 930 | 14.98 | 68.1 | 2.195 |
| 20 | 28 | 2.00 | 930 | 16.16 | 73.5 | 1.435 |
| 21 | 29 | 2.00 | 930 | 15.42 | 70.3 | 1.851 |
| 22 | 30 | 2.00 | 910 | 16.09 | 73.0 | 1.513 |
| 23 | 31 | 2.00 | 910 | 16.09 | 72.8 | 1.437 |
| 24 | 32 | 2.00 | 930 | 15.80 | 72.3 | 1.559 |
| 25 | 33 | 2.00 | 930 | 16.46 | 74.3 | 1.435 |
| 26 | 34 | 2.00 | 930 | 14.97 | 68.5 | 2.223 |
| 27 | 35 | 2.00 | 930 | 15.87 | 73.0 | 1.503 |
| 28 | 36 | 2.00 | 910 | 16.08 | 72.7 | 1.535 |
| 29 | 21 | 2.00 | 930 | 16.32 | 72.6 | 1.487 |
| 30 | 22 | 2.00 | 930 | 16.25 | 73.3 | 1.427 |

What is claimed is:

1. A process for forming a photovoltaic cell, the process comprising:
(a) providing a junction-bearing silicon semiconductor substrate having a front-side surface and a back-side surface and comprising one or more insulating films disposed onto at least said front-side surface of said silicon semiconductor substrate and a lightly doped emitter at said front-side surface of said silicon semiconductor substrate;
(b) applying a thick-film conductive paste composition onto at least a portion of said one or more insulating films to form a layered structure, said thick-film paste composition comprising:
i) 80-99.5 wt % of an electrically conductive metal;
ii) 0.5 to 20 wt % of a Pb—Te-based oxide; and
iii) an organic medium,
wherein said electrically conductive metal and said Pb—Te-based oxide are dispersed in said organic medium and wherein the above wt % are based on the total weight of said electrically conductive metal and said Pb—Te-based oxide, said Pb—Te-based oxide comprising 30-75 wt % PhO and 25-70 wt % $TeO_2$, wherein the oxide wt % are based on the total weight of the Pb—Te-based oxide; and
(c) firing said silicon semiconductor substrate, said one or more insulating films, and said thick-film paste, wherein said organic medium of said thick film paste is volatilized, thereby forming an electrode in contact with said one or more insulating layers and in electrical contact with said silicon semiconductor substrate.

2. The process of claim 1, said process further comprising a step of drying said thick-film conductor composition, wherein said step of drying is carried out following step (b) but before step (c).

3. The process of claim 1, said Pb—Te-based oxide comprising 36-52 wt % PbO and 35-55 wt % $TeO_2$, wherein the oxide wt % are based on the total weight of the Pb—Te-based oxide.

4. The process of claim 1, said Pb—Te-based oxide further comprising 0-2 wt % $Li_2O$, 0-4 wt % $Na_2O$ and 0-4 wt % $Cr_2O_3$, with the proviso that the total of the wt % of said $Li_2O$, said $Na_2O$ and said $Cr_2O_3$ is in the range of 0.5-8 wt %, wherein the oxide wt % are based on the total weight of the Pb—Te-based oxide.

5. The process of claim 4, said Pb—Te-based oxide further comprising 1.65-20 wt % $Bi_2O_3$, with the proviso that the total of the wt % of said $Li_2O$ and said $Bi_2O_3$ is in the range of 3.65-20 wt %, wherein the oxide wt % are based on the total weight of the Pb—Te-based oxide.

6. The process of claim 5, said Pb—Te-based oxide further comprising one or more oxides selected from the group consisting of $SiO_2$, $Al_2O_3$, $B_2O_3$, CuO, $TiO_2$, $Ag_2O$, NiO, $Fe_2O_3$ and $RuO_2$.

7. The process of claim 4, said Pb—Te-based oxide further comprising 0-2 wt % $Li_2O$, 0-4 wt % $Na_2O$ and 0-4 wt % $Cr_2O_3$, with the proviso that the total of the wt % of said $Li_2O$, said $Na_2O$ and said $Cr_2O_3$ is in the range of 0.5-4 wt %, wherein the oxide wt % are based on the total weight of the Pb—Te-based oxide.

8. The process of claim 7, said Pb—Te-based oxide further comprising 1.65-15 wt % $Bi_2O_3$, with the proviso that the total of the wt % of said $Li_2O$ and said $Bi_2O_3$ is in the range of 3.65-15 wt %, wherein the oxide wt % are based on the total weight of the Pb—Te-based oxide.

9. The process of claim 8, said Pb—Te-based oxide further comprising one or more oxides selected from the group consisting of $SiO_2$, $Al_2O_3$, $B_2O_3$, CuO, $TiO_2$, $Ag_2O$, NiO, $Fe_2O_3$ and $RuO_2$.

10. A photovoltaic cell comprising a lightly doped emitter, and an electrode formed from a thick-film conductive paste composition comprising:
i) 80-99.5 wt % of an electrically conductive metal;
ii) 0.5 to 20 wt % of a Pb—Te-based oxide; and
iii) an organic medium,
wherein said electrically conductive metal and said Pb—Te-based oxide are dispersed in said organic medium, wherein the above wt % are based on the total weight of said electrically conductive metal and said Pb—Te-based oxide, said Pb—Te-based oxide comprising 30-75 wt % PbO and 25-70 wt % $TeO_2$, wherein the oxide wt % are based on the total weight of said Pb—Te-based oxide and wherein said thick-film conductive paste composition has been fired to remove said organic medium and form said electrode.

11. The photovoltaic cell of claim 10, said Pb—Te-based oxide further comprising 0-2 wt % $Li_2O$, 0-4 wt % $Na_2O$ and 0-4 wt % $Cr_2O_3$, with the proviso that the total of the wt % of said $Li_2O$, said $Na_2O$ and said $Cr_2O_3$ is in the range of 0.5-8 wt %, wherein the oxide wt % are based on the total weight of said Pb—Te-based oxide.

12. The photovoltaic cell of claim 11, said Pb—Te-based oxide further comprising 1.65-20 wt % $Bi_2O_3$, with the proviso that the total of the wt % of said $Li_2O$ and said $Bi_2O_3$ is in the range of 3.65-20 wt %, wherein the oxide wt % are based on the total weight of said Pb—Te-based oxide.

* * * * *

UNITED STATES PATENT AND TRADEMARK OFFICE
CERTIFICATE OF CORRECTION

PATENT NO.         : 8,969,709 B2
APPLICATION NO.    : 13/598861
DATED              : March 3, 2015
INVENTOR(S)        : Brian J Laughlin et al.

Page 1 of 1

It is certified that error appears in the above-identified patent and that said Letters Patent is hereby corrected as shown below:

In the Claims

Column 23, line 15, please change "PhO" to read -- PbO --.

Signed and Sealed this
Thirtieth Day of June, 2015

Michelle K. Lee
*Director of the United States Patent and Trademark Office*